(12) United States Patent
Vosseler

(10) Patent No.: US 7,580,051 B2
(45) Date of Patent: Aug. 25, 2009

(54) METHOD AND APPARATUS FOR IMAGING A PRINTING FORM

(75) Inventor: Bernd Vosseler, Dossenheim (DE)

(73) Assignee: Heidelberger Druckmaschinen AG, Heidelberg (DE)

( * ) Notice: Subject to any disclaimer, the term of this patent is extended or adjusted under 35 U.S.C. 154(b) by 456 days.

(21) Appl. No.: 11/318,198

(22) Filed: Dec. 23, 2005

(65) Prior Publication Data
US 2006/0146121 A1 Jul. 6, 2006

(30) Foreign Application Priority Data
Dec. 23, 2004 (DE) .................. 10 2004 063 333

(51) Int. Cl.
*B41J 2/385* (2006.01)
*B41J 2/435* (2006.01)
*B41J 2/47* (2006.01)

(52) U.S. Cl. .................. 347/117; 347/131; 347/251; 347/250

(58) Field of Classification Search .......... 347/117, 347/131, 250, 251
See application file for complete search history.

(56) References Cited

U.S. PATENT DOCUMENTS

| | | | |
|---|---|---|---|
| 4,905,025 A | 2/1990 | Sakamoto et al. | |
| 5,734,393 A | 3/1998 | Eriksen | |
| 5,808,655 A * | 9/1998 | Haas et al. | 347/234 |
| 6,222,577 B1 | 4/2001 | Sousa | |
| 6,433,809 B1 * | 8/2002 | Kodama | 347/233 |
| 6,765,604 B2 | 7/2004 | Beier et al. | |
| 6,784,912 B2 | 8/2004 | Beier et al. | |
| 2002/0005890 A1 * | 1/2002 | Beier et al. | 347/238 |
| 2003/0081106 A1 * | 5/2003 | Marten et al. | 347/233 |
| 2005/0212899 A1 * | 9/2005 | Clarke et al. | 347/233 |

FOREIGN PATENT DOCUMENTS

| | | |
|---|---|---|
| DE | 100 31 915 A1 | 1/2002 |
| DE | 103 05 317 A1 | 9/2003 |

* cited by examiner

*Primary Examiner*—Stephen D Meier
*Assistant Examiner*—Sarah Al-Hashimi
(74) *Attorney, Agent, or Firm*—Laurence A. Greenberg; Werner H. Stemer; Ralph E. Locher

(57) ABSTRACT

A method for imaging a printing form is particularly suited for a printing form exposer or a printing unit of a press. A plurality of light sources produce image points in a row on the printing form whose spacing is greater than the minimum image point spacing. A first partial row of image points is produced with a first subset of the light sources and a second partial row is produced with a second subset. During a number of imaging steps, at least some of the image points of in each case one of the subsets is placed along the row in positions between image points of the respective partial row, produced in a previous imaging step, and in which, after the number of imaging steps, in a further imaging step, image points of the first subset are placed along the row at positions between image points of the second partial row from the preceding imaging step.

11 Claims, 3 Drawing Sheets

Fig. 3

METHOD AND APPARATUS FOR IMAGING A PRINTING FORM

BACKGROUND OF THE INVENTION

Field of the Invention

The invention relates to a method for imaging a printing form in a large number of imaging steps, in which, using a plurality of light sources, a plurality of image points whose spacing is greater than the minimum image point spacing is produced in a row on the printing form in one of the large number of imaging steps. A first partial row of image points is produced with a first subset of the plurality of light sources and a second partial row of image points is produced with a second subset and, during a number of imaging steps, at least some of the image points of the first subset are placed along the row in positions between image points of the first partial row, produced on the printing form in a previous imaging step. Further, at least some of the image points of the second subset are placed along the row in positions between image points of the second partial row produced on the printing form in a previous imaging step.

During the imaging of printing forms, printing form precursors, printing form blanks, or printing plates, which will all be designated a printing form below, in particular for offset printing, in order to produce a grid of halftone dots, use is made of imaging devices having one or more imaging modules (also frequently designated an imaging head). The imaging modules have a plurality of imaging channels or light sources whose image points on the printing form have a greater spacing than adjacent rows of image points or rows of printing points on the surface of the printing form (minimum image point spacing equal to the spacing of adjacent rows of image points). By way of suitable relative movement between the imaging modules and the printing form surface, in particular by means of movement or travel of the imaging module or imaging modules of the imaging device, the gaps between the already imaged rows of image points on the printing form must gradually be closed, until the rows of image points are lying closely, that is to say with the minimum image point spacing. For this purpose, each row of image points has to be traveled over at least once, preferably only once, with an imaging channel, so that the light beam of the light source assigned to the imaging channel can place an image point in accordance with a subject or printing image (including a color separation printing image) to be imaged.

German published patent application DE 100 31 915 and U.S. Pat. No. 6,784,912, for instance, disclose a so-called interleave method for the imaging of printing forms, in particular held on a printing form cylinder, in order to place image points closely. In the case of n imaging channels whose image points lie in a row on the printing form, the spacing p between adjacent image points in the row is an integer multiple of the spacing l between two image rows (or, respectively, the minimum spacing between two adjacent image points). The imaging device, after imaging a row of n image points and, if appropriate, after a number of further imaging operations of image points in the direction at right angles to the row (fast scan), is displaced in the direction of the row by the amount n*l relative to the printing form (slow scan). If the printing form is held on a cylinder, the imaging is carried out along lines of interleaved helices or screw lines. If the numbers n and p/l are relatively prime, then each image point in the image row is traveled over precisely once.

U.S. Pat. No. 4,905,025 describes a method for the imaging of a photosensitive layer held on a rotatable cylinder, in which the spacing of two image rows is half the spacing of two imaging channels. The gap between the lines of image points which is written by two adjacent channels from the first group of light sources is filled by the image points of channels from a second group of light sources in the subsequent revolution.

A further method for imaging a printing form on a printing form cylinder is disclosed in U.S. Pat. No. 6,222,577. An imaging module having a number of imaging channels which produce image points in a row on the printing form is displaced by one image line width substantially parallel to the axis of rotation after each revolution until the gaps between adjacent imaging channels have been closed. After that, the imaging module is displaced substantially parallel to the axis of rotation to such an extent that the next row written by the first imaging channel in the row adjoins the previous row written by the last imaging channel in the row. Since each imaging channel image images a continuous region having a sharp boundary in relation to the region of the adjacent imaging channel, even very small fluctuations in the outputs or beam properties of the individual imaging channels can be made out as stripes in the imaging.

Furthermore, U.S. Pat. No. 6,765,604 discloses a method and an imaging device in which, by means of at least two imaging modules, imaging of a printing form in a transition region on the printing form is carried out in such a way that a number of at least partly non-contiguous image points (image points with gaps, that is to say not all the set image points at the minimum image point spacing) in the transition region is carried out by the first of the two imaging modules, and the production of the complementary, at least partly non-contiguous image points in the transition region is carried out by the second of the two imaging modules. In particular, the imaging operations can be carried out by the at least two imaging modules with an interleave method, see for example U.S. Pat. No. 6,784,912. In this case, in the aforesaid transition region, the number of non-contiguous image points are those image points which are produced in the run-out region of the interleave method of the first imaging module, while the complementary, at least partially non-contiguous image points form the run-in region of the interleave method of the second imaging module.

In an interleave method with a fixed number of imaging channels, it may be disadvantageous that the local frequency therefore defined by the imaging method, in interplay with local frequencies of a grid to be imaged (for example of a specific color separation), leads to moiré patterns if the two local frequencies have a disadvantageous relationship with each other. This can be the case in particular when the relative displacement of the imaging modules in relation to the printing form and the spacing of the imaging channels from one another (in particular the pitch of the light sources) are not coordinated very exactly with one another. If the number of imaging channels is chosen so as to accord with the type of grid to be imaged, a lower efficiency of the imaging device has to be tolerated, in particular the selection of the amounts of the displacements (forward movements) is highly restricted. Difficulties often occur in the determination or detection of the grid used if the grid is not known or has been self-generated.

SUMMARY OF INVENTION

It is accordingly an object of the invention to provide a method for imaging a printing form which overcomes the above-mentioned disadvantages of the heretofore-known devices and methods of this general type and which is as insensitive as possible with respect to the tolerances occurring in the displacement of the imaging device relative to the printing form and/or the tolerances occurring in the pitch and/or is as insensitive as possible with respect to inhomogeneities in the optical light source output and the beam properties.

With the foregoing and other objects in view there is provided, in accordance with the invention, a method for imaging a printing form in a large number of imaging steps, which comprises:

providing a plurality of light sources with a first subset of light sources and a second subset of light sources;

producing, with the plurality of light sources, a plurality of image points at a spacing greater than a minimum image point spacing in a row on the printing form in one of the large number of imaging steps, and thereby producing a first partial row of image points with the first subset of light sources and a second partial row of image points with the second subset of light sources;

during a number of imaging steps, placing at least some of the image points of the first subset along the row in positions between image points of the first partial row, produced on the printing form in a preceding imaging step, and placing at least some of the image points of the second subset along the row in positions between image points of the second partial row produced on the printing form in a preceding imaging step; and subsequently carrying out a further imaging step and placing at least some of the image points of the first subset is along the row at positions between image points of the second partial row from the preceding imaging step.

In other words, the method according to the invention for imaging the printing form, an interleave method, comprises at least the following features: the printing form is imaged in a large number of imaging steps, using a plurality of light sources, a plurality of image points whose spacing is greater than the minimum image point spacing being produced in a row on the printing form in one of the large number of imaging steps. A first partial row of image points is produced with a first subset of the plurality of light sources and a second partial row of image points is produced with a second subset. During a number of imaging steps, at least some of the image points of the first subset are placed along the row in positions between image points of the first partial row, produced on the printing form in a previous imaging step, and at least some of the image points of the second subset are placed along the row in positions between image points of the second partial row produced on the printing form in a previous imaging step.

After the number of imaging steps, a further imaging step is carried out, in which at least some of the image points of the first subset are placed along the row at positions between image points from the second partial row from the preceding imaging step.

In the method according to the invention, imaging is therefore carried out with two relative forward movements/displacements between the image points of the light sources of the imaging device, in particular of the imaging modules, and the surface of the printing form. A first forward movement is carried out continuously in order to write a first and a second partial row in accordance with an interleave method. A second forward movement is carried out as an abrupt displacement in such a way that the first forward movement can be continued, iteration is possible. On average, consequently, exactly the same distance is covered as a row of closely located image points is imaged.

The image points are disjunct, in other words they do not overlap. As illustrated, the number of imaging steps for the imaging of partial rows is obviously greater than 1. The first and second partial rows can in particular lie along a line.

Consequently, after the large number of imaging steps, apart from a first and a second edge region, a row of image points with minimum image point spacing is imaged on the printing form. This is also the case for each of the partial rows: each of the partial rows has a first and a second edge region in which image points have gaps, since this is a direct consequence of the interleave method.

Expressed in other words, in the method according to the invention for imaging the printing form, using a plurality of light sources, a plurality of image points whose spacing is greater than the minimum image point spacing is produced in a row on the printing form in one of the large number of imaging steps. In a subsequent imaging step, at least some of the image points are placed at positions between image points of the row which has been produced on the printing form in a preceding imaging step, so that, after the large number of imaging steps, apart from a first and a second edge region (a starting edge comprising image points placed in a small number of the imaging steps chronologically at the start of the imaging of the row and an end edge comprising image points placed in a small number of the imaging steps chronologically at the end of the imaging of the row), a row of image points with minimum image point spacing is imaged on the printing form. In one of the large number of imaging steps, using a first subset of the plurality of light sources, the first partial row of image points is produced and, using a second subset, a second partial row of image points is produced. During a number of imaging steps, in a subsequent imaging step at least some of the image points of the first subset are placed at positions between imaging points of the first partial row from a preceding imaging step, and at least some of the image points of the second subset are placed at positions between image points of the second partial row of a preceding imaging step. After the number of imaging steps, a further imaging step is carried out, in which at least some of the image points of the first subset are placed along the row at positions between image points of the second partial row from the preceding imaging step.

In the imaging method according to the invention, the method steps of the imaging in a number of imaging steps and in a further imaging step can be iterated or repeated.

Furthermore, according to the invention, in the further imaging step of the method, imaging of imaging points by means of the first subset of the plurality of light sources is carried out at positions on the printing form at which imaging of imaging points by the second subset of the plurality of light sources is or would be carried out if the imaging in the number of imaging steps were continued by an additional imaging step. Expressed in other words, a further forward movement is carried out exactly with the amount such that the first subset comes to lie at positions of the second subset as if the original forward movement were to be maintained.

It is particularly advantageous and preferred to carry out the method in a printing form held on a cylinder, the cylinder being rotated and the plurality of light sources being moved substantially parallel to the axis of rotation of the cylinder in such a way that the image points produced on the printing form by the plurality of light sources is placed along helices or screw lines running around the axis of rotation of the cylinder, the rows of image points considered in the method lying along a specific azimuth angle of the cylinder and being oriented substantially parallel to the axis of rotation.

In the method according to the invention for imaging the printing form, from a first to a second imaging step of the number of imaging steps, a forward movement of the plurality of light sources in the direction of the row can be greater than the spacing between two adjacent image points which are placed in the first and in the second partial row in one imaging step of the number of imaging steps.

It is particularly advantageous and preferred if the local frequency defined by the forward movement in the number of imaging steps in the method according to the invention is chosen to be different from the local frequency of a grid of the subject to be imaged.

In an advantageous embodiment, the method is carried out with a plurality of light sources on an imaging module. In particular, the plurality of light sources can be located on a laser diode bar, in particular can be laser diodes.

In other words, expressed briefly and in summary, in the interleave imaging method according to the invention, two different forward movements/displacements are provided: a first forward movement is carried out in order to write rows of image points in accordance with an interleave method, in particular continuously in the case of two-dimensional exposure, in one dimension an interleave method of interleaved helices being used if the printing form is held on a printing form cylinder. A second forward movement is carried out as an abrupt displacement in such a way that the interleave method can be continued with the first forward movement, iteration then being possible. The local frequency induced by the first forward movement has a beneficial value as compared with the local frequency of the grid used. In addition, the first forward movement is preferably chosen such that good thorough mixing of imaging channels takes place, that is to say, in order to write a region or stripe, use is made of imaging channels which are located in a distributed manner along the row of light sources. By means of the second forward movement, on average exactly the same distance is covered as is also imaged.

Also related to the idea of the invention is an apparatus for imaging a printing form which is suitable for carrying out a method according to the invention in accordance with this illustration. An apparatus of this type according to the invention, in particular an imaging device, in particular having one or more imaging modules, is connected to a computing unit for the interchange of data and/or control signals, a program which has at least one subregion having instructions for carrying out the method as claimed in one of the preceding claims being stored in a memory unit of the computing unit. The apparatus can in particular comprise an imaging device as described in the document DE 100 31 915 or U.S. Pat. No. 6,784,912. These documents are incorporated by reference in the disclosure content of this illustration.

The method according to the invention can be implemented in a printing form exposer or in a printing unit having an imaging device. A printing form exposer according to the invention, be it a flatbed or a drum exposer (CtP system, computer to plate system), is distinguished by at least one apparatus according to the invention as disclosed in this illustration.

The printing unit according to the invention is distinguished by at least one apparatus according to the invention as disclosed in this illustration. The printing unit can be a direct or indirect planographic printing unit, a conventional or water-free offset printing unit, a flexographic printing unit or the like.

A printing unit according to the invention can be integrated into a press, in particular a sheet-fed press. A press according to the invention is distinguished by at least one printing unit according to the invention. A sheet-fed press according to the invention can have a feeder, at least one printing unit, typically four, six, eight or ten printing units arranged in series, if appropriate a finishing unit (punching, creasing or perforating unit or varnishing unit) and a deliverer. The sheet-fed press can be a turning machine (recto and verso press).

Further advantages and advantageous embodiments and developments of the invention will be illustrated by using the following figures and their descriptions. In the drawings, in detail:

Other features which are considered as characteristic for the invention are set forth in the appended claims.

Although the invention is illustrated and described herein as embodied in a method for imaging a printing form, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF A PREFERRED EMBODIMENT

Figure 1:
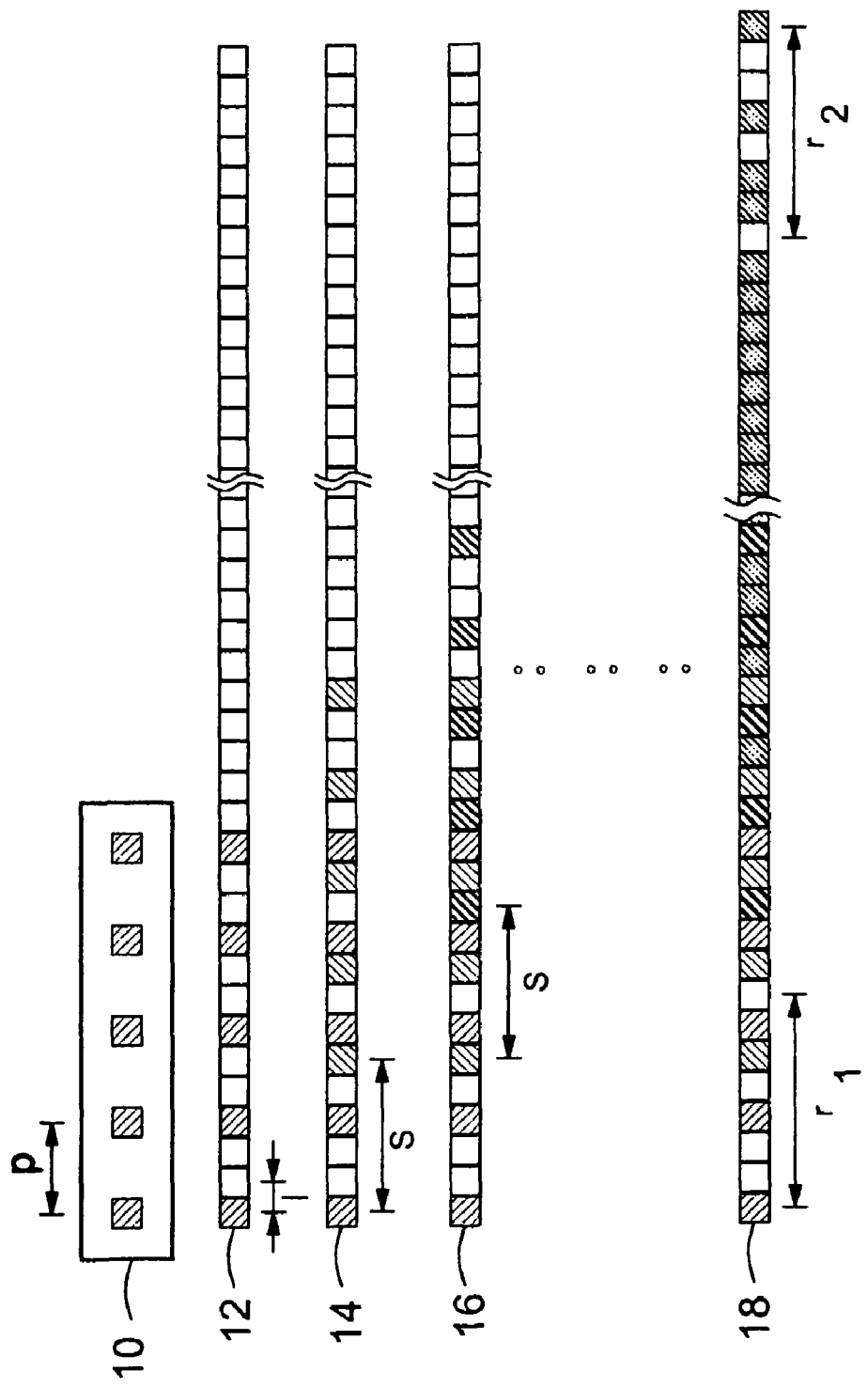
FIG. 1 shows an embodiment of the imaging of a partial row in an interleave method according to the invention using a subset of light sources of an imaging module, the subset producing five image points whose spacing amounts to three minimum image point spacings.

Before the individual figures are discussed, for a better understanding, the method according to the invention will be discussed by using an embodiment using an imaging module having 64 imaging channels (i.e., light sources, image points on the printing form, since there is a direct functional relationship). In a typical printing form exposer or a typical imaging device which is integrated into a printing unit, the individual adjacent image points of such an imaging module have a spacing p of about 170 μm (micrometers), individual image points having a diameter of about 10 μm (micrometers). Therefore, the minimum spacing l between adjacent image points (measured from comparable points, for example from center to center of the image points), is 10 μm (micrometers), also designated a unit, that is to say p/l=17. Given a forward movement of 8 units along the row, 8 active imaging channels, in particular the channels 1 to 8, produce the image points with uniform spacing on the printing form, close imaging after a short initial edge (run-in region), since the forward movement and the number of imaging channels used are relatively prime with the spacing of adjacent image points in one imaging step. In this regard, see also the illustration in the above-noted German publication DE 100 31 915 and U.S. Pat. No. 6,784,912. Likewise, the imaging channels 9 to 16 would produce close imaging which is displaced by 8 times 17 units in each case. The path of the image point of channel 1 would already be covered or swept over by 17 imaging steps (also revolutions, if the printing form is held on a cylinder and two-dimensional imaging is carried out) by the path of the image point from channel 9. In other words, the paths of channel 9 and channel 1 coincide. The same is true of the other channels: channel 10 and channel 2, channel 11 and channel 3, and so on.

In the method according to the invention for imaging the printing form, as based on the values listed here by way of example, the image data which channel 1 would write in the 18th imaging step is already written by channel 9 in the 1st imaging step, the image data which channel 1 would write in the 27th imaging step is already written by channel 17 in the 1st imaging step, and so on for each group (subset) each having 8 imaging channels (light sources) of the total of 64 imaging channels (light sources) of the imaging module. In this way, after 17 imaging steps with 64 channels, the same imaging which would be produced in a region after 8 times 17 imaging steps with 8 channels is produced: a closely imaged subregion of approximately the total width of the imaging module, having a starting edge (run-in region) and an end edge (run-out region) which are in each case not closely imaged. This region is also designated a stripe and comprises a variety of areas which in each case have been imaged closely by a group and a plurality of transition regions which in each case have been imaged closely by a first and a second adjacent group. In a further imaging step, the imaging module is then moved by a forward movement t to such an extent that channel 1 writes exactly in the first gap of the end edge (run-out region) of the stripe. Since each of the paths of the image points along which the channels write in the stripe is guided further after 17 imaging steps by the channel having the number greater by 8, in the end edge of the stripe there are 8 open path ends, channel 1 adjoining the first open path end, channel 2 adjoining the second, and so on for the channels 3 to 8. Thus, the end edge of a first, previously imaged stripe is supplemented exactly by the starting edge of a second, subsequently imaged stripe to form close imaging. This fact is independent of the choice of number explained here by way of example; in particular it is independent of the fact that, in this example, 64 channels are divided into 8 groups of 8 channels. For instance, 3 groups of 7 channels each, that is to say a total of 21 channels, could also interact appropriately in the method according to the invention in order to produce close imaging. This method, of carrying out 17 forward movements by 8 channels in each case and then positioning channel 1 in the first end edge (run-out region), is repeated or iterated, in particular until the entire printing form has been imaged.

Generalized, the embodiment mentioned of the method according to the invention can be described as follows: n imaging channels having a spacing p between adjacent image points (between two adjacent channels) are displaced by p imaging steps (in particular revolutions for the case of two-dimensional imaging on a cylinder) by s units (1<s<n) in each case, s and p being relatively prime, and in the (p+1)th imaging step, a forward movement by $t=(n-p)*s+s$ units being carried out.

Continuing with the exemplary numerical values cited above, three versions are to be cited in order to explain advantages of the method according to the invention: While in the conventional interleave method, with the simultaneous use of 64 imaging channels (s=64) with 17 units spacing between adjacent image points, the right-hand neighbor (in the forward movement direction) of each image point from the channel lying offset by 49 channel positions to the right, and the left-hand neighbor (in the direction opposite to the forward movement) of the channel lying offset by 15 positions to the left, the image points being imaged with a minimum spacing of 4 imaging steps earlier and, respectively, 13 imaging steps later, with a forward movement of s=16 in the method according to the invention, each channel images on the left beside the image point which its adjacent channel has previously written in an imaging step with a spacing of 17 units. Consequently, virtually all the adjacent image points are placed by adjacent imaging channels in successive imaging steps (obviously successive revolutions in the case of two-dimensional imaging of a printing form on a cylinder). In the case of each 17th image point, the one adjacent image point is then placed by the imaging channel lying offset by 15 positions. In this way, by the temporal and physical spacing of adjacent image points being kept small during imaging, the case is advantageously ruled out in which disruptions or faults accumulate during the imaging: The intended spacing between two adjacent image points of two imaging channels can be maintained more accurately than between two imaging channels lying further apart from each other. In addition, any possible forward movement error of the imaging module over one imaging step (in particular revolution) is lower than over 15 imaging steps. In the case of the forward movement s=33 in the method according to the invention, on the other hand, adjacent image points are written in the next imaging step by an imaging channel offset to the right by 2 positions, each 17th image point is imaged by an imaging channel offset to the left by 31 positions. Given such a forward movement, not only is the accumulation of errors prevented but, in addition, effective thorough mixing of the imaging channels is carried out. A stripe of 17 units is written by channels which are located in a distributed manner over half the width of the row of imaging channels. In this way, variations or inhomogeneities of the light source parameters, in particular laser parameters, such as the pitch (spacing of the light sources in the imaging module) and size of the image points, have a less severe effect on the imaging quality.

Whereas, in the conventional interleave method, the characteristic local frequency depends on the number of imaging channels available, in the method according to the invention, the forward movement s and the total number of imaging channels n are independent of each other. If an imaging channel fails and it is necessary to continue writing with the largest still contiguous row of imaging channels, this has no influence on the forward movement s and therefore no influence either on the characteristic local frequency of the imaging method.

In addition, the entire set of all numbers which are relatively prime with p is available as values for the forward movement s, so that, by means of appropriate selection of s, the local frequency of an imaging operation can easily be changed in order to avoid interference with a grid frequency.

By means of the imaging step with forward movement t, carried out regularly, the total width of the imaging can also be varied to a small extent without having to dispense with optimum matching of the forward movement s with regard to the avoidance or reduction of moiré patterns. If the width of the forward movement t is changed by a small amount e as compared with the theoretically exact value, the imaging is wider or narrower after a number of imaging steps, in proportion to the number. The method according to the invention can thus be used, for example, in conjunction with width variations in the imaging which are used to compensate for the sheet lengthening transversely with respect to the printing direction during printing.

Furthermore, it should also be mentioned that, in imaging devices having a plurality of imaging modules, the method according to the invention can be used firstly within an imaging module and also in interaction with at least two imaging modules. However, in order to prevent a moiré pattern in the transition region of two imaging modules, the nested imaging of the run-in region of the one of the two imaging modules and the run-out region of the other of the two imaging modules should be omitted (smooth module connection), and only the closely imaged region of a stripe should be used.

Referring now to the figures of the drawing in detail and first, particularly, to FIG. 1 thereof, there is shown an embodiment of the imaging of a partial row in an interleave method according to the invention using a subset of light sources of an imaging module, the subset producing five image points whose spacing is three minimum image point spacings. As a general explanation, it will be stated in advance that, in order to image a grid pattern of grid points on the printing form, the image points over the surface of the printing form (printing area) will initially be displaced with a component at right angles to the direction defined by the line of the image points, so that what is known as grid scan lines, also designated lines for short, are produced. A close row of image points is then understood to mean a row which is produced by the subsequent displacement in the direction defined by the direction of the row of image points of the imaging channels and, accordingly, represents image points located at the same height of different lines written beside one another, the image points being located at the minimum spacing l from one another.

The spacings of the n image points which are produced simultaneously by a number of light sources are chosen to be constant, the length p between two adjacent image points is advantageously an integer multiple m of the spacing l of two grid points, that is to say $p=m \times l$. Continuous imaging, in which each grid point is touched at least once by the image point of a light source, having n simultaneously written image points at the spacing $p=m \times l$ is always possible if a suitable forward movement is chosen for the displacement. Continuous imaging in which each grid point is written exactly once is possible in particular when the number of image points n, the step width being $s=n \times l$, and the spacing p of adjacent image points, measured in units of the spacing l of the grid points, have no common divisor. Expressed in another way, n and m are relatively prime. This is the case, for example, when m and n are different prime numbers or powers of different prime numbers. In the case of such an imaging operation in the interleave method, at the start and at the end of the row to be written, in each case an edge (starting edge r1 and end edge r2) of a size $r=n \times m-(n+m-1)$ is produced. Therefore, in the example shown in FIG. 1: $r=3 \times 5-(3+5-1)=8$.

Since the individual light sources, in particular lasers on a diode laser bar, can be driven individually, it is possible to configure each grid point individually in accordance with the subject to be imaged. The output of a specific laser beam which is provided in order to inscribe a grid point is defined in accordance with the given image data information. Therefore, individual blackening of various grid points can be achieved.

In FIG. 1, in which grid points are illustrated in simplified form as little boxes, a group or subset of light sources of an imaging module 10 writes five image points substantially at the same time or simultaneously in one imaging step, adjacent image points having a spacing p. In the first imaging operation 12, five grid points having the spacing $p=3 \times 1$ are written. There follows a displacement of the subset of light sources 10 by a forward movement s in such a way that the group of grid points produced simultaneously is displaced by five grid points in the direction defined by the row of image points, here, for example, to the right (n=5; s=5; m=3; relatively prime). In the second imaging step 14, five image points are again placed after a forward movement s. In iteration, renewed displacement by five grid points to the right is carried out, so that, in the following imaging step 16, five points are again placed. It can be seen from this sequence that the printing form can be imaged without gaps or closely in the row: each position of a grid point illustrated by a little box coincides once with the image point of a light source. In each renewed imaging operation after a forward movement s to the right, the same pattern or this same sequence of already written and as yet unwritten grid points is produced continuously, as can be seen in the schematic illustration of the iterated imaging operation 18. The row of written image points therefore still has certain gaps with unwritten grid points at its right-hand end. If a further imaging operation of five grid points is then carried out at the right-hand end edge r2 of this illustration, then this same sequence of as yet unwritten and already written grid points is produced. At the same time, the proportion of completely written grid points of the row becomes longer and longer.

In each iterated imaging operation 18, the starting edge of the size r1 and the end edge of the size r2, in this case of eight grid points, measured in units of the spacing l of the image points, can be seen. It should be emphasized here that the ordered set of grid points, for example numbered from left to right, of the starting edge r1 has a pattern which is complementary to the ordered set of grid points in the end edge r2.

Figure 2:
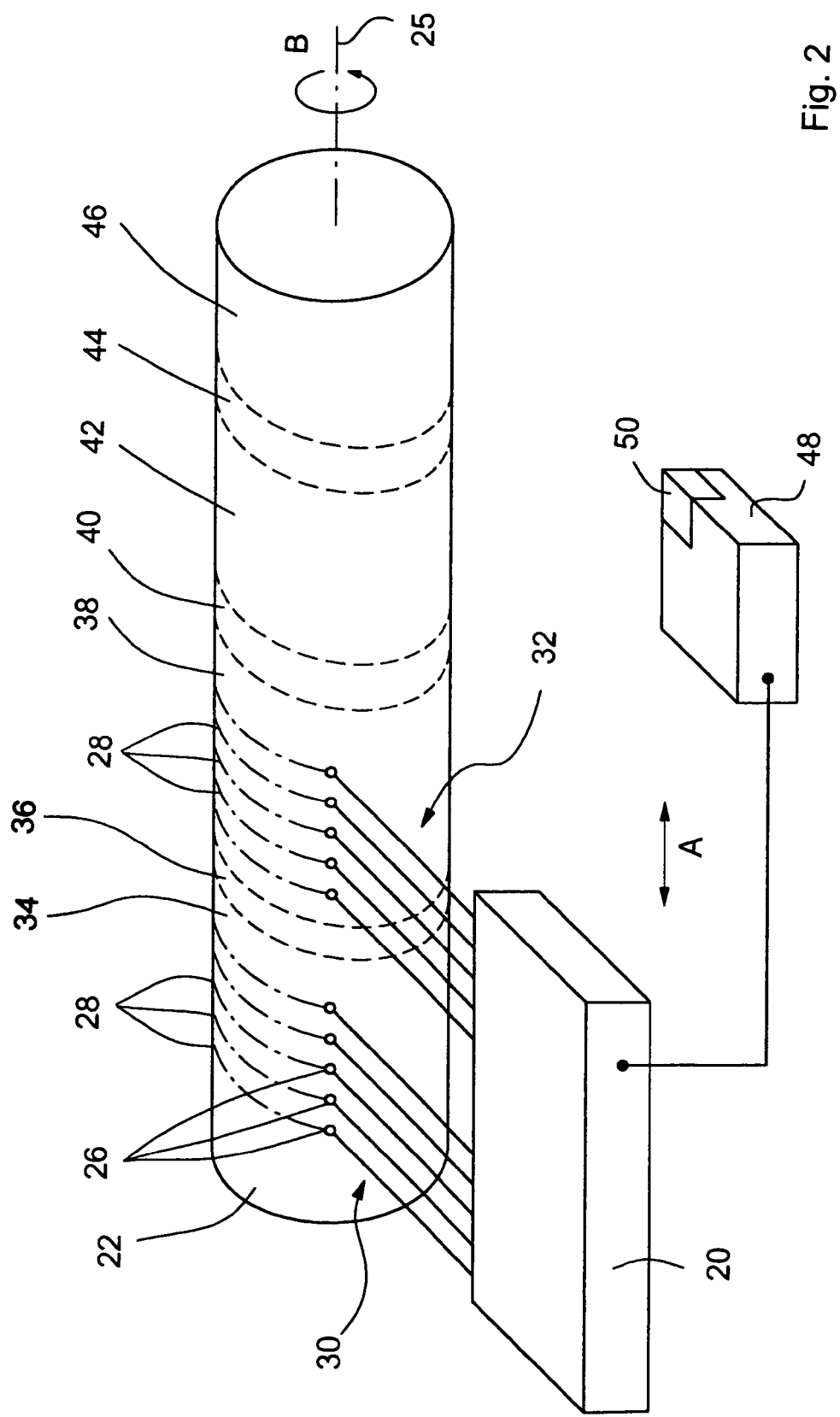
FIG. 2 is a diagrammatic perspective view of an advantageous embodiment of the imaging of a printing form held on a cylinder by way of two subsets of light sources on an imaging module, which expose the printing form in respectively associated areas and transition regions.

FIG. 2 illustrates an advantageous embodiment of the imaging of a printing form 22 by means of two subsets of light sources on an imaging module 20, which expose the printing form 22 in respectively associated areas and transition regions. It shows schematically the imaging of a printing form 22 which is located on a rotatable cylinder 24, as can be performed in a printing form exposer or a printing unit of a press. By means of translation A of the imaging module 20 substantially parallel to the axis of rotation 25 and rotation B of the cylinder 24 about the axis of rotation 25, it is possible for the image points 26 of the light sources on the imaging module 20 to sweep over the surface of the printing form (printing area) along paths 28 which are shaped like screw lines or helices, so that the entire printing area can be imaged. In order to explain the imaging according to the method of the invention, by way of example a first subset 30 and a second subset 32 of the light sources is shown, here 5 light sources in each case as an example, whose image points lie in a row and which have a spacing p of 3 units (minimum spacing l). Given a forward movement s of 5 units (grid points) along the row, with each of the subsets 30, 32, in each case imaging can be performed individually in an interleave method, as has been explained in the preceding description with reference to FIG. 1. To this end, the imaging module 20 and therefore the image points 26 are now moved in conjunction with the rotation B of the cylinder 24 about its axis of rotation 25 and substantially parallel to the axis of rotation 25 with the translation A in such a way that the stroke or pitch of the helical paths is just so large that the forward movement s is achieved during one revolution, that is to say when the image points 26 reach the same azimuth angle of the printing form 22.

However, as has already been explained, in the case of imaging according to the invention with the first and second subsets 30, 32 at the same time, the situation arises in which, in a specific imaging step, the image points 26 of the first subset 30 encounter positions of grid points on the printing form 22 at which imaging by the second subset 32 has already been performed in the preceding imaging steps. Expressed in other words, there are areas on the printing form which are imaged by the first subset 30 on its own, areas which are images by the second subset 32 on its own and transition regions which are imaged both by the first subset 30 and by the second subset 32. At this point, it should be emphasized that, in the method according to the invention, the division into areas imaged by one of the subsets on its own depends to a great extent on the choice of the number of subsets and their position in relation to one another, and also parameter combinations could have the effect that none of the areas imaged by one of the subsets on its own occurs, in this regard see also the example of 8 subsets of 8 light sources of an imaging device of 64 imaging channels. Without restricting the generality of parameter combinations, an illustrative example is shown in the figures for the purpose of understanding the method according to the invention and explained in this illustration.

In the example shown in FIG. 2, given a forward movement s in a number of imaging steps, a first area 34 on the printing form 22 is imaged by the first subset 30, in a first transition region 36 the image points 26 of the first and second subset 30, 32 act in a complementary manner, and the second area 38 is imaged by the second subset 32. An end edge has already been placed by the second subset in a second transition region 40. Following the completion of the imaging of these regions (one stripe according to the nomenclature used above), according to the invention a forward movement t is carried out in such a way that, in a further imaging step, the imaging by the first subset 30 can be continued in the second transition region 40 in a manner complementary to the imaging by the second subset 32. The imaging of the printing form 22 is then continued with a forward movement s in a number of imaging steps, so that a third area 42 is imaged by the first subset 30, a third transition region 44 is imaged both by the first and by the second subset 30, 32 in interaction in a complementary manner, and a fourth area 46 is imaged by the second subset 32 of the light sources.

The imaging module 20 is connected to a computing unit 48 which comprises a memory unit 50. Stored in the memory unit 15 is a computer program to be executed by the computing unit 48, which comprises at least part for carrying out the method according to the invention. In other words, the imaging module 20 is driven in such a way that the method according to the invention is implemented.

Figure 3:
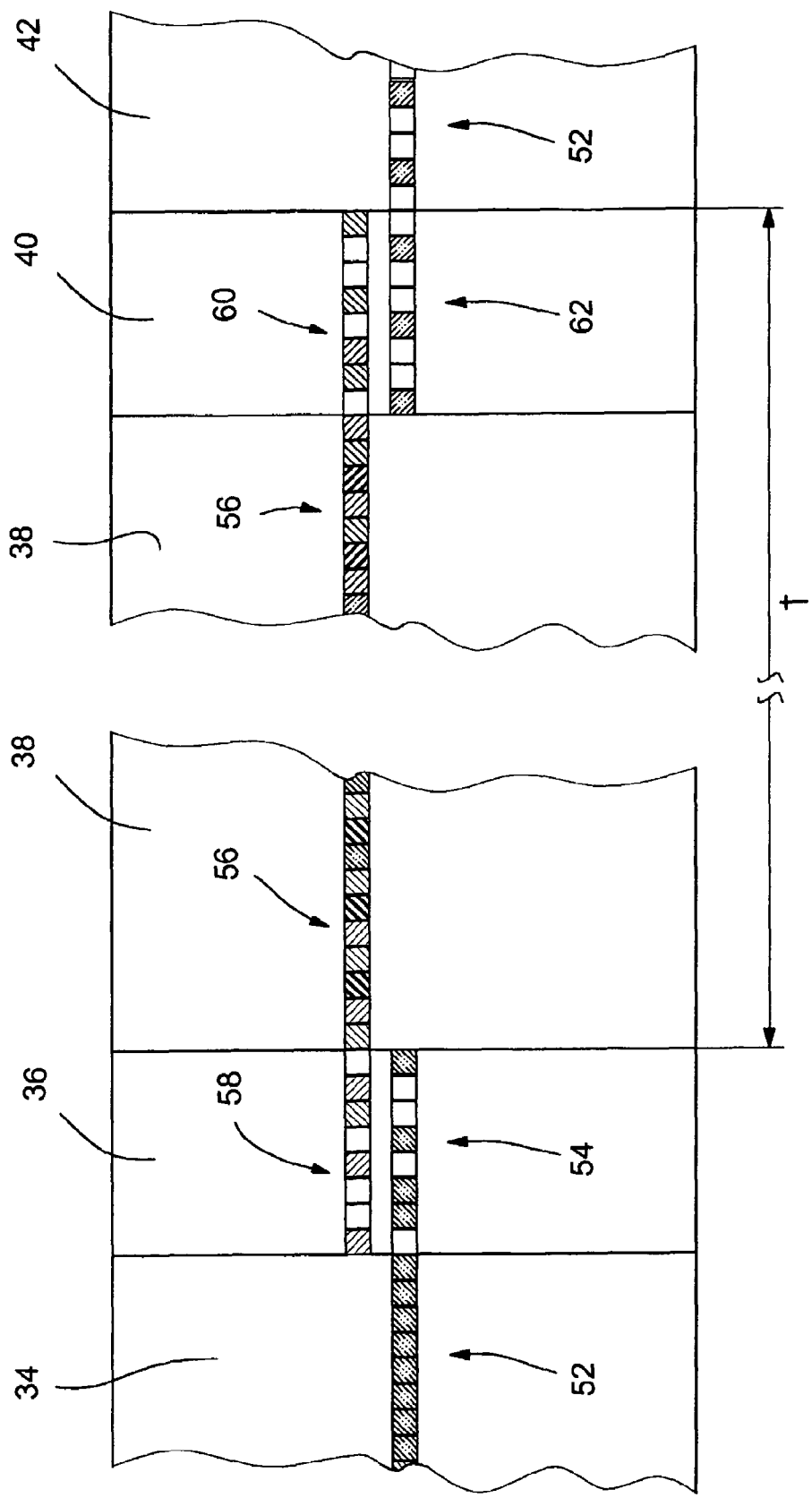
FIG. 3 shows a schematic illustration of two transition regions in order to explain the action of the further imaging step in the method according to the invention.

FIG. 3 relates schematically to two transition regions in order to explain the action of the further imaging step in the method according to the invention in accordance with the embodiment in the example shown in FIG. 2. Merely in order to simplify the illustration, the grid points of one row or row of image points, which in reality lies substantially parallel to the axis of rotation of the cylinder at a specific azimuth angle, are shown as offset spaced apart in the vertical direction in FIG. 3, depending on whether they are placed by the image points 26 of the first subset 30 of light sources (bottom) or by image points 26 of the second subset 32 of light sources (top). Shown schematically in the left-hand part of FIG. 3 is the first transition region 36 between the first area 34 and the second area 38 on the printing form 22, all the grid points having been set in accordance with the invention after a number of imaging steps with a forward movement s. While, in the first area 34, the first subset 30 produces a closely located row or image point row 52 of grid points, an end edge 54 has been imaged by the first subset 30 in the first transition region 36. While, in the second area 38, the second subset 32 writes a closely located row or image point row 56 of grid points, a starting edge 58 has been imaged by the second subset 32 in the first transition region 36. End edge 54 and starting edge 59 supplement each other to form a closely located row of grid points; they are complementary to each other. Shown schematically in the right-hand part of FIG. 3 is the second transition region 40 between the second area 38 and the third area 42 on the printing form 22. After the number of imaging steps with a forward movement s, an end edge 60 has been imaged by the second subset 32 in the second transition region 40 while, as already mentioned, a close row 56 of grid points has been produced in the second area 38.

For the next imaging step, a translation A with the forward movement t is made in such a way that the image points 26 of the first subset 30 continue the imaging of the second subset 32. Expressed in another way, the forward movement s is such that the image points 26 of the first subset 30 are positioned in such a way that they supplement the end edge 60 of the second subset 32 in the second transition region 40 by producing a starting edge 62. FIG. 3 shows that, in the next imaging step, of the four grid points which have not yet been set, three are imaged by image points 26 of the first subset. The fourth grid point, which is then still not yet set, at the position 6 in the second transition region 40 is imaged in the subsequent imaging step after a forward movement s. In this way, the imaging can be continued in a number of imaging steps with a forward movement s. It is now clear that the method according to the invention can be iterated until the entire lateral width of the printing form 22 has been imaged since, after the same number of imaging steps with forward movement s, the same situation occurs with exchanged roles for the first and second subset 30, 32. FIG. 2 shows schematically, by way of example, that its width is already swept over completely by repeating the number of imaging steps.

This application claims the priority, under 35 U.S.C. § 119, of German patent application DE 10 2004 063 333.9, filed Dec. 23, 2004; the entire disclosure of the prior application is herewith incorporated by reference.

I claim:

1. A method for imaging a printing form in a large number of imaging steps, which comprises:

providing a plurality of light sources with a first subset of light sources and a second subset of light sources;

producing, with the plurality of light sources, a plurality of image points at a spacing greater than a minimum image point spacing in a row on the printing form in one of the large number of imaging steps, and thereby producing a first partial row of image points with the first subset of light sources and a second partial row of image points with the second subset of light sources;

during a number of imaging steps, placing at least some of the image points of the first subset along the row in positions between image points of the first partial row, produced on the printing form in a preceding imaging step, and placing at least some of the image points of the second subset along the row in positions between image points of the second partial row produced on the printing form in a preceding imaging step;

subsequently carrying out a further imaging step and placing at least some of the image points of the first subset along the row at positions between image points of the second partial row from the preceding imaging step; and choosing a local frequency defined by the forward movement in the number of imaging steps to be different from the local frequency of a grid of a subject to be imaged.

2. The method for imaging a printing form according to claim 1, which comprises iterating the imaging steps of the number of imaging steps and the further imaging step.

3. The method for imaging a printing form according to claim 1, wherein the further imaging step comprising imaging imaging points with the first subset of light sources at positions on the printing form at which the second subset of light sources would image imaging points if the imaging in the number of imaging steps were continued by an additional imaging step.

4. The method for imaging a printing form according to claim 1, which comprises:

holding the printing form on a cylinder, rotating the cylinder about an axis of rotation thereof, and moving the plurality of light sources substantially parallel to the axis of rotation, to thereby place the image points produced on the printing form by the plurality of light sources along helices running around the axis of rotation, wherein the rows of image points lie along a specific azimuth angle of the cylinder and are oriented substantially parallel to the axis of rotation.

5. The method for imaging a printing form according to claim 1, which comprises: from a first imaging step to a second imaging step of the number of imaging steps, setting a forward movement of the plurality of light sources in the direction of the row greater than the spacing between two adjacent image points that are placed in the first and in the second partial row in one imaging step of the number of imaging steps.

6. The method for imaging a printing form according to claim 1, which comprises providing and carrying out the method steps with a plurality of light sources on an imaging module.

7. The method for imaging a printing form according to claim 1, which comprises providing and carrying out the method steps with a plurality of light sources on a laser diode bar.

8. In an apparatus for imaging a printing form, comprising a computing unit for interchanging data and/or control signals, a memory unit connected to said computing unit, and a program stored in said memory unit with computer-executable instructions for carrying out the method according to claim 1.

9. A printing form exposer having at least one apparatus according to claim 8.

10. A printing unit, having at least one apparatus according to claim 8.

11. In a printing press, a printing unit with a computing system configured to execute program instructions with method steps according to claim 1.

* * * * *